US012763111B2

(12) United States Patent
Adhinarayanan et al.

(10) Patent No.: US 12,763,111 B2
(45) Date of Patent: Oct. 13, 2026

(54) LOGIC DIE-BASED TECHNIQUES FOR DRAM ROW SEGMENTATION AND FINE-GRAINED ACCESSES ON STACKED MEMORY

(71) Applicant: Advanced Micro Devices, Inc., Santa Clara, CA (US)

(72) Inventors: Vignesh Adhinarayanan, Austin, TX (US); Hyung-Dong Lee, Austin, TX (US); Bradford Beckmann, Bellevue, WA (US); Seyedmohammad Seyedzadehdelcheh, Bellevue, WA (US); Sergey Blagodurov, Bellevue, WA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 147 days.

(21) Appl. No.: 18/671,854

(22) Filed: May 22, 2024

(65) Prior Publication Data

US 2024/0395289 A1 Nov. 28, 2024

Related U.S. Application Data

(60) Provisional application No. 63/468,767, filed on May 24, 2023.

(51) Int. Cl.
*G11C 5/02* (2006.01)
*G11C 11/408* (2006.01)
(Continued)

(52) U.S. Cl.
CPC ............ *G11C 5/02* (2013.01); *G11C 11/4085* (2013.01); *G11C 11/4087* (2013.01);
(Continued)

(58) Field of Classification Search
CPC ... G11C 5/02; G11C 11/4085; G11C 11/4087; G11C 11/4091; G11C 11/4095;
(Continued)

(56) References Cited

U.S. PATENT DOCUMENTS 8,988,946 B1 * 3/2015 D'Abreu ............ G11C 13/0028
365/185.23
10,049,044 B2 * 8/2018 Boyer ................. G06F 12/0804
(Continued)

OTHER PUBLICATIONS

M. O'Connor et al., "Fine-Grained DRAM: Energy-Efficient DRAM for Extreme Bandwidth Systems," 2017 50th Annual IEEE/ACM International Symposium on Microarchitecture (MICRO), Boston, MA, USA, 2017, pp. 41-54.
(Continued)

*Primary Examiner* — Viet Q Nguyen
(74) *Attorney, Agent, or Firm* — Patterson + Sheridan, LLP

(57) ABSTRACT

Integrated circuit (IC) memory devices and methods for fabricating the same are provided. In one example, an integrated circuit (IC) memory device is provided that includes a substrate, at least two or more memory (IC) dies, and a non-memory IC die integrated in a chip package. The memory (IC) dies are stacked on the substrate to form a memory die stack. The non-memory IC die contains row segmentation logic having an output routed to corresponding wordline drivers of the memory IC dies through vertical wiring passing through the memory die stack.

19 Claims, 8 Drawing Sheets

(51) Int. Cl.

| | |
|---|---|
| ***G11C 11/4091*** | (2006.01) |
| ***G11C 11/4096*** | (2006.01) |
| ***H10B 80/00*** | (2023.01) |
| ***H10W 90/00*** | (2026.01) |
| *H10W 90/20* | (2026.01) |

(52) U.S. Cl.
CPC ...... *G11C 11/4091* (2013.01); *G11C 11/4096* (2013.01); *H10B 80/00* (2023.02); *H10W 90/00* (2026.01); *H10W 90/297* (2026.01); *H10W 90/792* (2026.01)

(58) Field of Classification Search
CPC .... H10B 80/00; H10W 90/00; H10W 90/297; H10W 90/792
USPC .............................................................. 365/51
See application file for complete search history.

(56) References Cited

U.S. PATENT DOCUMENTS

| | | | | |
|---|---|---|---|---|
| 10,608,633 | B1 * | 3/2020 | Schreiber | H03K 19/017581 |
| 10,622,088 | B2 * | 4/2020 | Choi | G11C 29/4401 |
| 10,956,044 | B2 * | 3/2021 | Xu | G06F 12/0284 |
| 11,171,076 | B2 * | 11/2021 | Yu | H01L 24/19 |
| 11,295,805 | B2 * | 4/2022 | O | G11C 11/4078 |
| 11,594,531 | B2 * | 2/2023 | Yang | H10D 88/00 |
| 11,607,754 | B2 * | 3/2023 | Rammel | B23K 37/0452 |
| 11,735,565 | B2 * | 8/2023 | Zhou | G11C 8/12 327/565 |
| 11,756,951 | B2 * | 9/2023 | Chang | H10D 88/00 257/774 |
| 11,990,369 | B2 * | 5/2024 | Bhuyan | H10P 14/61 |
| 12,073,251 | B2 * | 8/2024 | Challapalle | G06F 9/4843 |
| 12,277,985 | B2 * | 4/2025 | Waller | G11C 29/785 |
| 12,399,855 | B2 * | 8/2025 | Yudanov | G06F 13/4068 |
| 12,399,885 | B2 * | 8/2025 | Kelly | G06F 16/23 |
| 2010/0110745 | A1 * | 5/2010 | Jeddeloh | G11C 29/04 365/230.06 |
| 2014/0181458 | A1 * | 6/2014 | Loh | G06F 12/1027 711/206 |
| 2014/0247637 | A1 * | 9/2014 | Best | G11C 5/02 365/51 |
| 2014/0376320 | A1 * | 12/2014 | Loh | G11C 29/76 365/200 |
| 2017/0352433 | A1 * | 12/2017 | Son | G11C 5/025 |
| 2018/0137005 | A1 * | 5/2018 | Wu | G11C 7/10 |
| 2019/0196742 | A1 * | 6/2019 | Yudanov | G06F 3/0604 |
| 2020/0027521 | A1 * | 1/2020 | Choi | G11C 29/4401 |
| 2020/0301776 | A1 * | 9/2020 | Cha | H03M 13/19 |
| 2022/0130466 | A1 * | 4/2022 | Bazarsky | G11C 16/08 |

OTHER PUBLICATIONS

T. Zhang, et al., "Half-DRAM: A high-bandwidth and low-power DRAM architecture from the rethinking of fine-grained activation," 2014 ACM/IEEE 41st International Symposium on Computer Architecture (ISCA), Minneapolis, MN, USA, 2014, pp. 349-360.
H. Ha, et al., "Improving energy efficiency of DRAM by exploiting half page row access," 2016 49th Annual IEEE/ACM International Symposium on Microarchitecture (MICRO), Taipei, Taiwan, 2016, pp. 1-12.
Chapter 23: Wafer-Level Packaging (WLP), Hereogeneous Integration Roadmap 2021 Edition, 36 pages.

* cited by examiner

LOGIC DIE-BASED TECHNIQUES FOR DRAM ROW SEGMENTATION AND FINE-GRAINED ACCESSES ON STACKED MEMORY

CROSS-REFERENCE TO RELATED APPLICATIONS

This application claims priority to the U.S. Provisional Patent Application Ser. No. 63/468,767 filed May 24, 2023, which is incorporated herein by reference in its entirety.

BACKGROUND

Field of the Invention

Implementations described herein generally relate to integrated circuit (IC) memory devices, such as chip packages among others, having stacked IC memory dies, and in particular, stacked memory having operational logic located remotely from the stacked IC memory dies.

Description of the Related Art

Large dynamic random access memory (DRAM) rows require increased activation energy, thus limiting the number of in-flight row activation commands and reducing irregular bandwidth. Conventional solutions have introduced additional circuitry in the DRAM die to reduce DRAM row size, thus decreasing capacity and increasing area overhead.

Traditional DRAM banks activate each row by sending a signal through the wide master word line (MWL) to four local word lines (LWLs) connected via local word line drivers (LWD). Each LWL is selected by a distinct LWLSel signal, routed underneath each bank. To select one of four rows under a MWL, a pre-decoded signal is sent via the LWLSel to drive one of the four LWLs, activating a wide DRAM row.

Fine-grained DRAM divides a bank into two grains and routes a grain select (GrSel) signal under the bank. Each GrSel signal governs half of the LWDs, selected by a circuit that performs a logical AND operation between LWLSel and GrSel. This approach reduces the row size compared to traditional DRAM. Half-DRAM divides each wordline into two halves and activates one half of memory cells in odd mats and the other half in even mats. This implementation introduces circuitry in the DRAM die and changes the wiring inside a DRAM mat, which increases area overhead. Staggered LWL wiring, used in modern DRAM bank implementations, requires undesirably doubling the number of LWDs, further increasing area overhead.

Half Page Row introduces circuitry within the LWD for row segmentation logic, which reduces the number of LWDs by a factor of two and spans the LWLs to two DRAM mats instead of one. However, this approach also incurs additional area overhead due to increased LWD area. Additionally, column select lines (CSL) connects to twice as many bitlines within a MAT. Similarly, the number of local data lines (LDLs) also double to maintain burst length. These changes increase the capacitance of wires, thus increasing the value of timing parameters such as $t_{RC}$, tRP, tRAS, and $t_{RCD}$, all of which reduce the irregular bandwidth.

Therefore, there is a need for improved stacked memory device.

SUMMARY

Integrated circuit (IC) memory devices, such as chip packages among others, having stacked IC memory dies, and in particular, stacked memory having operational logic located remotely from the stacked IC memory dies, along with methods for fabricating the same are provided herein. In one example, an IC memory device is provided that includes a memory die stack coupled with a non-memory IC die. The memory die stack includes at least two or more stacked memory IC dies form. The non-memory IC die contains in-die logic circuitry that has an output routed to circuitry of the memory IC dies through vertical wiring passing through the memory die stack.

In another example, an integrated circuit (IC) memory device is provided that includes a substrate, at least two or more memory (IC) dies stacked on the substrate to form a memory die stack, and, a non-memory IC die. The non-memory IC die contains row segmentation logic circuitry having an output routed to corresponding wordline drivers of the memory IC dies through vertical wiring passing through the memory die stack.

In yet another example, a method for operating a memory device is provided. The method includes transmitting, from a row decoder circuitry located in a non-memory IC die to a memory IC die stacked therewith, a signal causing a portion of memory cells coupled to a common word line to be selected; and reading bits from the selected memory cells.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Figure 1:
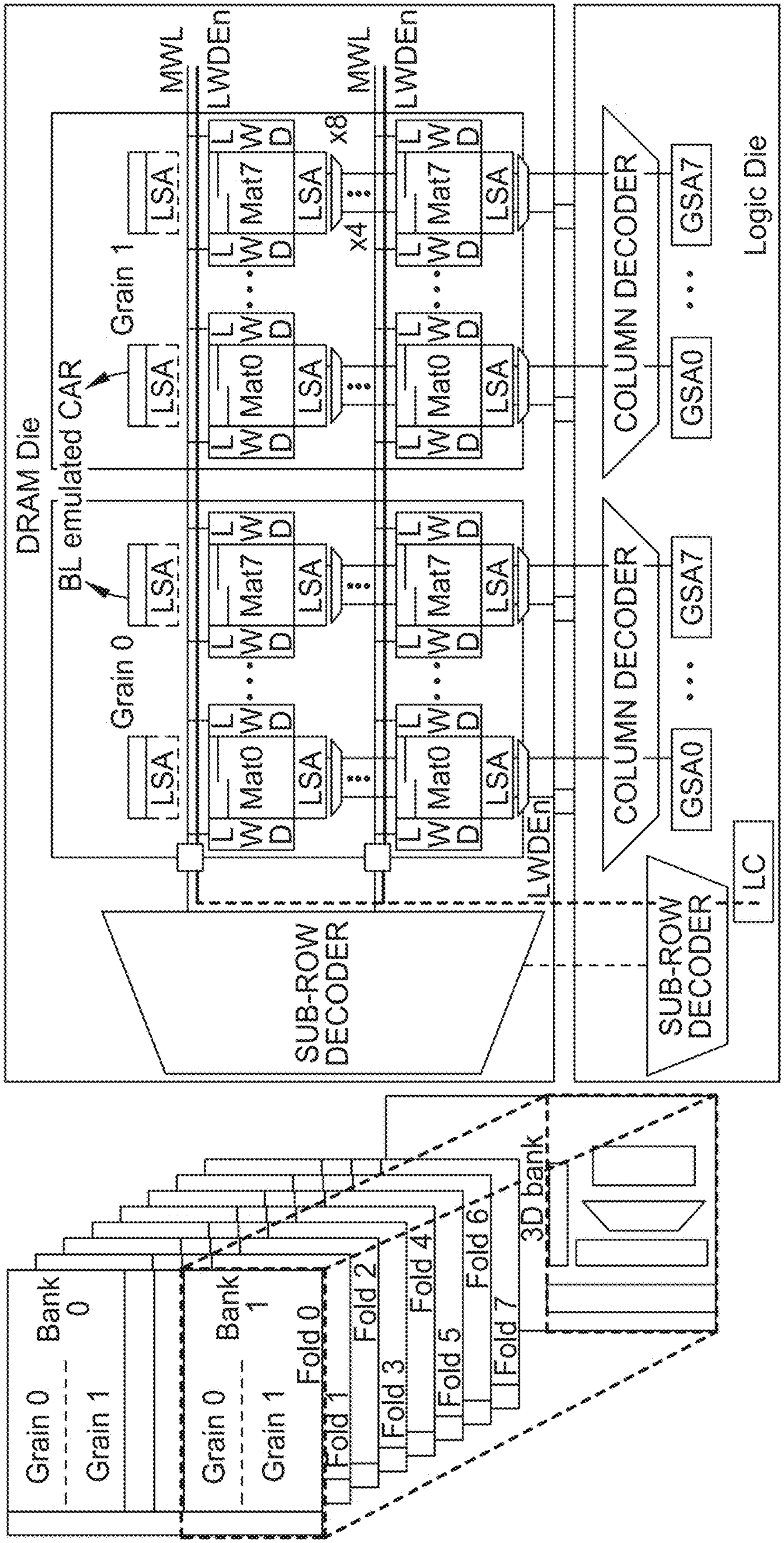
FIG. 1 is a schematic illustration of an integrated circuit (IC) memory device having folded banks.

Examples described herein can be beneficially utilized in high bandwidth (HBM) based 3D-stacked memory. However, the disclosed technology can also be adapted other 3D-stacked memory with sufficient vertical connectivity. Non 3D-stacked memory can also implement some of the logic in a separate chip and route the additional wires. Some examples of the disclosed technology free space within the memory IC die by moving at least a portion of the memory operational circuitry to a non-memory IC die within the chip package (e.g., memory device). Other examples additionally reduces the amount of row activation energy required for DRAM devices by row segmentation logic. The row segmentation logic may also be located remotely from the memory IC die, thus making more space available within the memory IC die for memory, in-memory processing circuitry, or other types of circuitry.

The activation energy required for DRAM devices is determined by the size of their rows, which also limits the number of row activation commands that can be processed simultaneously. Previous methods of reducing row size have introduced additional circuitry and wiring, resulting in reduced capacity and increased area overhead on the DRAM die.

To address this issue, DRAM row segmentation logic is implemented in a newly introduced logic die (or adding circuitry to the existing buffer die) on a 3D stacked memory device. In other words, the DRAM row segmentation logic is present in another integrated circuit (IC) that is stacked with or within the same chip package as the memory IC dies comprising the stacked memory device. The output of the row segmentation logic is routed to the corresponding wordline drivers in the DRAM die through additional vertical wiring in the TSV strip. The cost of additional TSVs is offset by hybrid bonding, and the cost of the logic die is amortized by new functionality such as processing-in-memory (PIM) such as arithmetic-logical-units (ALUs), in the base die. This results in lower energy consumption and higher irregular bandwidth on the 3D stacked memory device.

Locating circuitry responsible for selecting WORD lines for DRAM row segmentation in a newly introduced logic die (non-memory die or the pre-existing buffer die) in the base layer of 3D stacked memory enables more space with in the memory IC die for memory cells without loss of performance. The output of the row segmentation logic in the base die is routed vertically via additional TSVs and subsequently delivered to the target DRAM bank. The TSVs are typically per-bank and physically local the bank which is achieved via high-density TSVs from hybrid bonding.

The grain architecture approach allows for smaller rows to be activated by dividing a DRAM bank into two grains. Each grain contains half the number of mats and data pins (i.e., contact pads), and also divides the LSA and GSA stripes in half, creating two independent datapath within the banks, as shown in FIG. 1.

In some high bandwidth memory applications, master wordline (MWL) are connected to four wordline segments (LWLs) each via the local word line drivers (LWDs). 17 such LWDs drive the LWLs in a subarray. Each LWD drives LWL arms to its left and right, enabling 256 access transistors connected to the arm in each memory mat. The mats at the left and right end of subarrays have arms extending only to the right and left, respectively. To select only one of four LWLs connected to the wordline, a LWLSel signal is routed below a bank. This signal acts as an enable signal into the LWD's transistors.

To accommodate independent row activations across two grains within a bank, an additional LWD with only one LWL arm is added at the boundaries of the grain, as indicated in FIG. 1. During a row activation, the wordline needs to drive the LWLs in only half the LWDs corresponding to the target grain. To select which grain is to be activated within a bank, additional GrSel signal wires and additional logic circuits are required per DRAM bank. Thus, grain memory architecture can be effectively implemented without incurring significant area for the added circuits compared to conventional designs by leveraging the additional logic die in the base layer.

Figure 2:
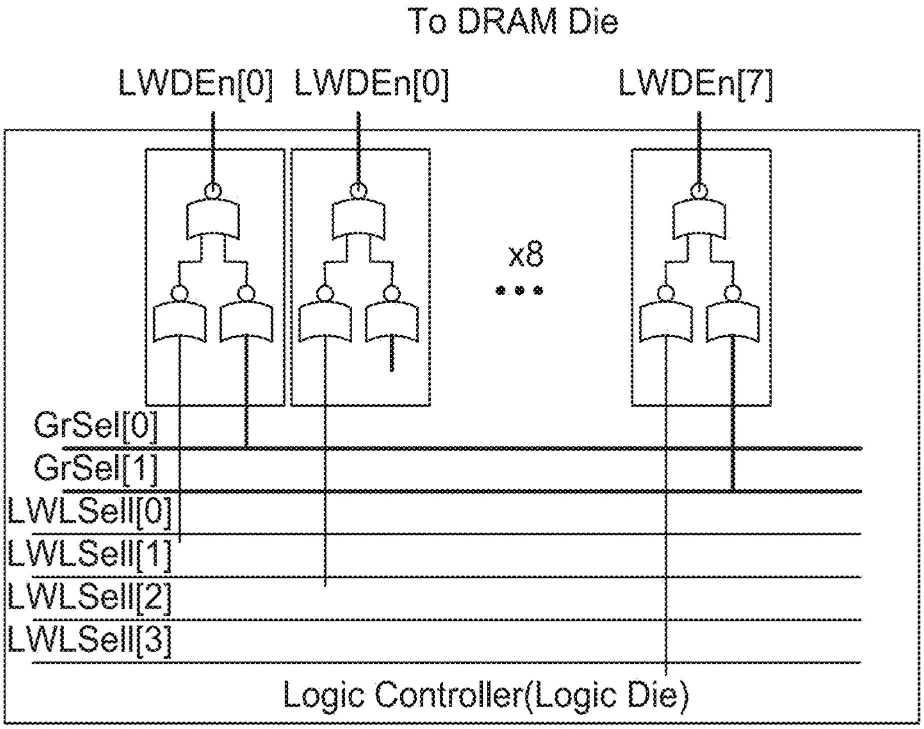
FIGS. 2 and 3 are circuit level implementations details of fine-grained rows in a memory die having folded back architecture.

To achieve smaller rows in the 3D bank design, row segmentation logic is implemented in a non-memory IC die, such as the base IC die. In a grain design having folded banks, logical-AND of GrSel and LWLSel are performed in the logic die to obtain an LWD enable signal (LWDEn). The LWDEn is then routed vertically via the TSVs to the target DRAM (or other memory) die, as illustrated in FIG. 2. In the DRAM die, the LWDEn signal is routed to drive different LWDs depending on the grain that is being targeted, as shown in FIG. 3.

The exemplary fine-grained row configuration reduces DRAM row size without increasing the DRAM die area. Compared to previous conventional designs, the area overhead is lower to achieve the same reduction in activation energy and improvement in irregular bandwidth. Furthermore, the free space in the base layer can be re-purposed for adding additional functionality such as implementing PIM ALUs, providing for a more flexible design.

Implementing the DRAM row segmentation logic in the non-memory or base IC die by performing a logical AND of a grain (or sub bank) selection wire and the LWLSel wire in the base die and then routing the output of the AND operation vertically eliminates the need for adding circuitry to the DRAM die and helps save area.

Figure 3:
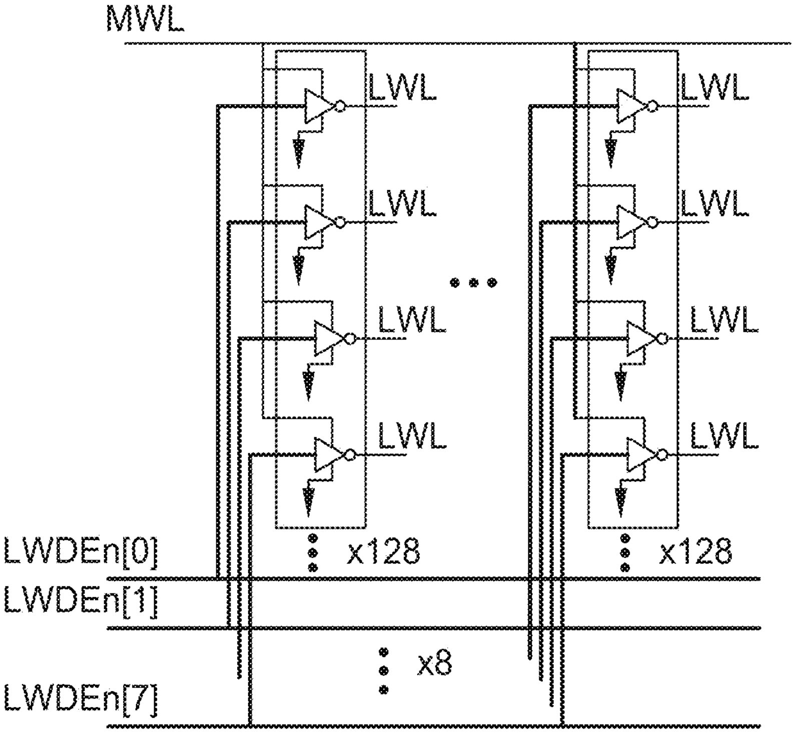

While hybrid bonding incurs negligible additional costs for TSVs, the disclosed technique uses extra signaling tracks in the DRAM die, as illustrated in FIG. 3. The baseline HBM design employs 128 routing tracks for MWL, 16 tracks for 8 differential LDLs, and 4 tracks for LWLSel. On the other hand, prior grain architectures added two more tracks for GrSel. In contrast, the disclosed technique replaces the 4 tracks for LWLSel and 2 tracks for GrSel, with 8 tracks for LWLEn. Despite this, the area cost for the two additional tracks is only 1.01% over previous designs while eliminating the need for circuits that consume 14% die area.

Partitioning the banks vertically into grains either decreases the atom size of each access or increases the $t_{BURST}$ value for the baseline DRAM atom size. Furthermore, the timing parameters would include a new grain-to-grain delay for row and column accesses. Other timing parameters such as $t_{CCD\_L}$ would also see a marked decrease from the 3D bank design. The new timing parameters would need to be documented in JEDEC specifications. The updated timing parameter values would be made available for use by the memory controller.

Figure 4:
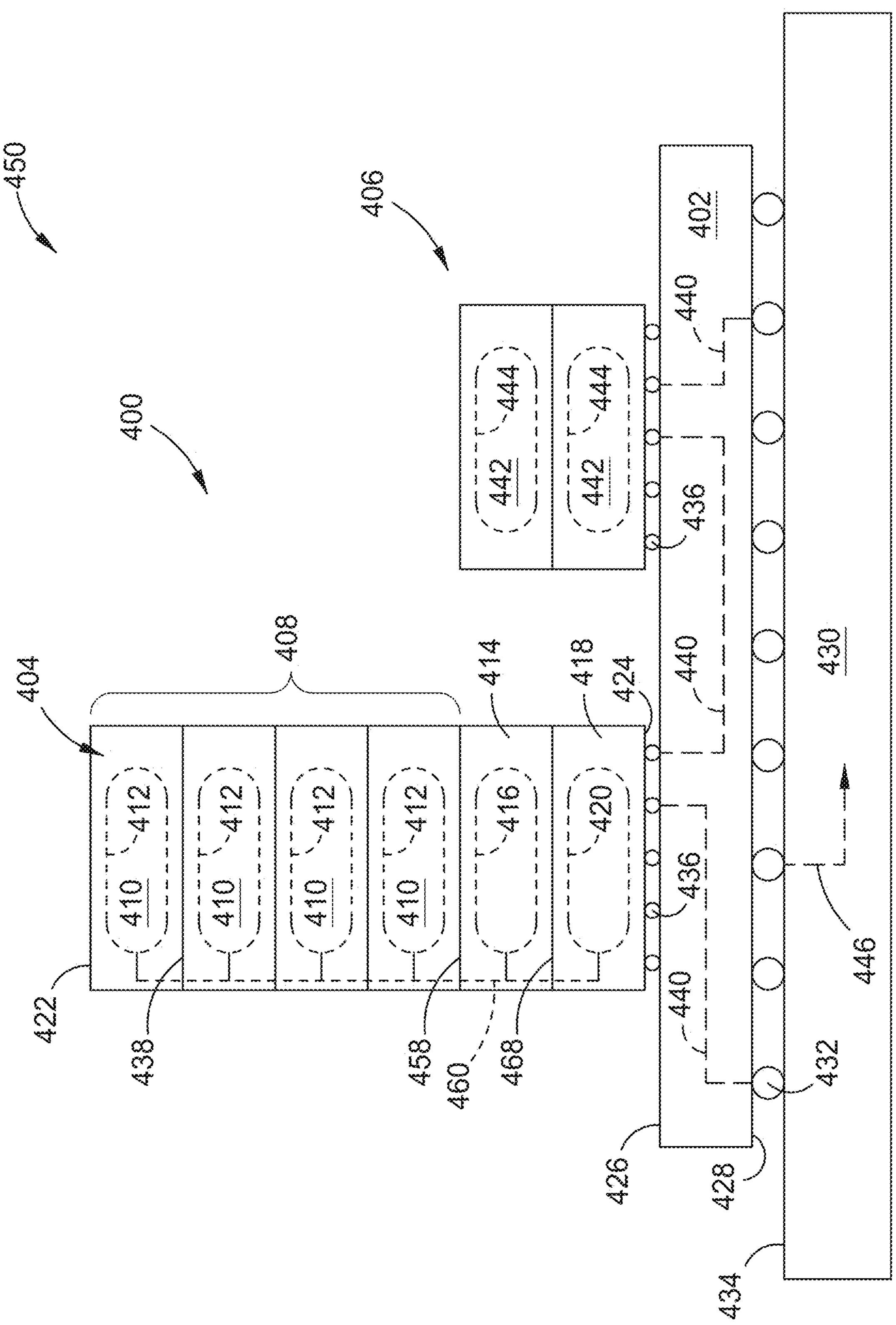
FIG. 4 is a schematic illustration of a chip package having stacked integrated circuit (IC) memory dies coupled to a non-memory IC die that includes operational logic located remotely from the stacked IC memory dies

Turning now to FIG. 4, a schematic illustration of an integrated circuit (IC) memory device, such as a chip package 400, having stacked integrated circuit (IC) memory IC dies 410 coupled to a non-memory IC die 414 that includes operational logic 416 located remotely from the stacked IC memory dies 410. That is, some or all of the operational logic 416 for controlling the read-write function of the memory dies 410 is remote from, i.e., not within, the memory dies 410. The stacked IC memory dies 414 form a memory stack 408. The memory stack 408 is coupled with the non-memory IC die 414 and a base IC die 418 to form a first chip complex 404. The first chip complex 404 includes a top surface 422 and a bottom surface 424. The top surface 422 may optionally be interface with a thermal management device (not shown in FIG. 1). An example of a thermal management device is a heat sink or a liquid heat exchanger.

The bottom surface 424 is coupled to a top surface 426 of a substrate 402 via solder interconnects 436. The substrate 402 may be package substrate or an interposer used in combination with a package substrate. The first chip complex 404 is also coupled to the substrate 402 via solder interconnects 436. The solder interconnects 436 may be solder microbumps or other suitable electrical connection suitable for transferring ground, signal and power transmissions between the routing circuitry of the substrate 402 and the functional circuitry of the IC dies within the chip complex 404.

A second chip complex 406 is also coupled to the top surface 426 of the substrate 402 via solder interconnects 436. The second chip complex 406 generally includes at least one compute die 442. The compute die 442 includes functional circuitry 444. The functional circuitry 444 may include CPU cores and/or GPU cores. The functional circuitry 444 of the compute dies 442 may also include System Management Unit (SMU) circuitry. The SMU circuitry configured to monitor thermal and power conditions and adjust power and cooling to keep the compute dies 442 functioning as within specifications. The functional circuitry 444 of the compute die 442 may also include DFX Controller IP circuitry. The DFX circuitry provides management of hardware or software trigger events. For example, the DFX circuitry may pull partial bitstreams from memory and delivers them to an ICAP. The DFX circuitry also assists with logical decoupling and startup events, customizable per Reconfigurable Partition. GPU cores when contained in the functional circuitry 444 of the compute die 442 generally includes math engine circuitry. The math engine circuitry is generally designed for task specific computing, such as used data center computing, high performance computing and AI/ML computing. Along with the accelerated compute cores, functional circuitry of the compute die 442 may also include SMU circuitry and DFX circuitry.

The functional circuitry 444 of the compute dies 442 and the functional circuitry of the IC dies comprising the first chip complex 404 are connected via routing 440 formed in, on, and/or through the substrate 402. The bottom surface 428 of the substrate 402 is mounted on a top surface 434 of a printer circuit board (PCB) 430. The routing 440 of the substrate 402 is coupled by solder balls 432 to circuitry 446 formed in the PCB 430.

The chip package 400 mounted to the PCB 430 forms an electronic device 450. The electronic device 450 may be a tablet, computer, server, data center, call center, automobile on-board electronics system, copier, digital camera, smart phone, control system, automated teller machine, call center, computing system, gaming system, artificial intelligence system, or a machine learning system, among others.

Referring back to the memory stack 408 of the first chip complex 404, each memory IC die 410 of the memory stack 408 includes functional circuitry 412. The functional circuitry 412 of the each memory IC die 410 may be configured as volatile memory or non-volatile memory. For example, the functional circuitry 412 when configured as such as volatile memory may be static random-access memory (SRAM), dynamic random-access memory (DRAM) or other suitable volatile memory type. Alternatively, the functional circuitry 412 of the memory circuitry of the memory IC die 410, when configured as non-volatile memory, may be ferroelectric random-access memory (FeRAM) and magnetoresistive random-access memory (MRAM) or other suitable non-volatile memory type.

Adjacent surfaces 438 of the memory IC dies 410 are mechanically and electrically coupled via hybrid bonding. Hybrid bonding uses layers of dielectric and patterned metal, such as copper, formed on the adjacent surfaces 438 of the memory IC dies 410. The patterned metal forms routings that include patterned lines and via. The routing terminate at bond pads. The patterned lines and via of the routing are electrically isolated from one another by a plurality of dielectric layers. The dielectric layers are formed from a material suitable for hybrid bonding, such as polybenzoxazole (PBO), polyimide (PI), benzocyclobutene (BCB), a combination thereof, or the like.

The hybrid bond is made by contacting the adjacent surfaces 438 of the memory IC dies 410. The exposed dielectric material on one of the memory IC dies 410 fusion bonds to the exposed dielectric material of the adjacent memory IC die 410 to bonded structures (e.g., adjacent memory IC dies 410) together. Subsequently, the metal-to-metal bonds may be formed using pressure and heat to form eutectic metal bonds between the exposed bond pads now in contact with each other. The interfusion of the metal materials of the bond pads to create the electric interconnect between the functional circuitry 412 of the memory IC dies 410 being bonded together.

The memory stack 408 generally includes a stack of one or more memory IC dies 410. Although four memory IC dies 410 are shown in the memory stack 408 illustrated in FIG. 4, the memory stack 408 may include 2, 3, 5, 6, 7, 8 or more memory IC dies 410 stacked in a single column. Alternatively, the memory IC dies 410 may be stacked in two or more columns where the width of a tier of memory IC dies 410 across multiple columns do not exceed the width of the non-memory IC die 414.

Adjacent sides 458 of the non-memory IC die 414 and the adjacent memory IC die 410 are mechanically and electrically coupled via hybrid bonding. Hybrid bonding, as discussed above, connects the functional circuitry 412 of the memory IC dies 410 to the operational logic 416 of the non-memory IC die 414. The operational logic 416 of the non-memory IC die 414 generally controls the read and write functions, row activation, precharge, and bank refreshes of the memory arrays and banks comprising the functional circuitry 412 of the memory IC dies 410. The operational logic 416 is later described in greater detail with respect to FIG. 7.

Continuing to refer to FIG. 4, adjacent sides 468 of the non-memory IC die 414 and the adjacent base IC die 418 are mechanically and electrically coupled via hybrid bonding. Hybrid bonding, as discussed above, connects the operational logic 416 of the non-memory IC die 414 and functional circuitry 420 of the base IC die 418. The functional circuitry 420 of the base IC die 418 is connected by the solder interconnects 436 to the routing 440 of the substrate 402. The functional circuitry 420 of the base IC die 418 generally includes memory buffer circuitry and routing circuitry The operational circuitry 416 of the non-memory IC die 414 is coupled to the functional circuitry 412 of the memory IC die 410 by vertical wiring 460. The vertical wiring 460 includes vias formed within the memory and non-memory IC dies 414, 414, and the connections across the routing comprising the hybrid bond connection between adjacent dies. The vertical wiring 460 may also couple the functional circuitry of the base IC die 418 to the functional and/or operational circuitry 412, 414 of the memory and non-memory IC dies 414, 414.

Figure 5:
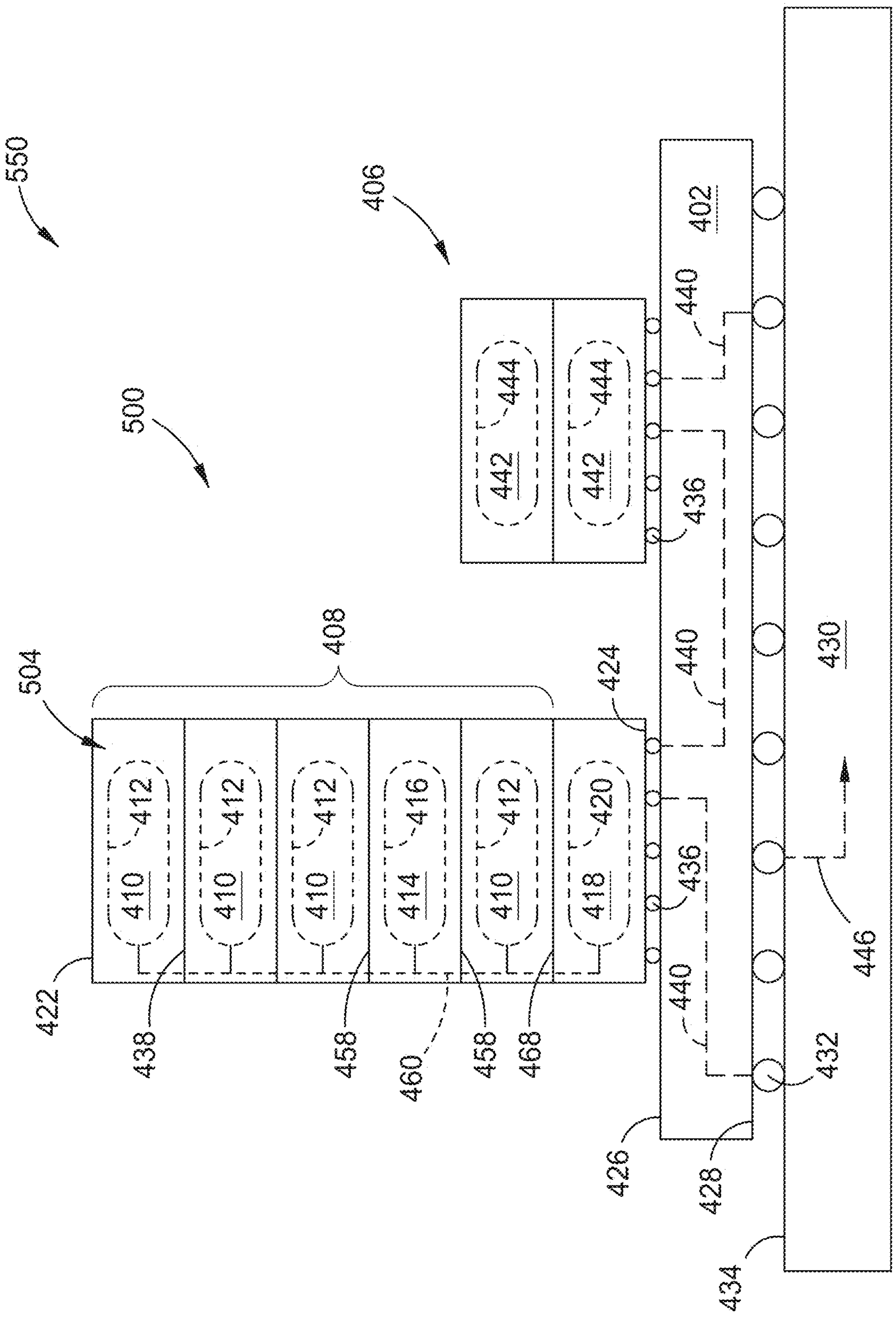
FIG. 5 is a schematic illustration of another example of chip package having stacked integrated circuit (IC) memory dies coupled to a non-memory IC die that includes operational logic located remotely from the stacked IC memory dies.

FIG. 5 is a schematic illustration of a chip package 500 having stacked integrated circuit (IC) memory IC dies 410 coupled to a non-memory IC die 414 that includes operational logic 416 located remotely from the stacked memory IC dies 410.

The chip package 500 is generally the same as the chip package 400 described above, except that chip package 500 has a chip complex 504 that replaces the chip complex 404 of chip package 400. Similar to the chip complex 404, the chip complex 504 includes a memory stack 408, a non-memory IC die 414, and a base IC die 418. The base IC die 418 of the chip complex 504 is coupled to the substrate 402 via solder interconnects 436. The memory stack 408 of the chip complex 504 is different than the memory stack 408 of the chip complex 404 in that the non-memory IC die 414 is located within the memory stack 408. Stated differently, the non-memory IC die 414 is hybrid bonded on its top and bottom surfaces to adjacent memory IC dies 410, thus locating the non-memory IC die 414 within the memory stack 408.

As with the chip package 400, the operational circuitry 416 of the non-memory IC die 414 is coupled to the functional circuitry 412 of the memory IC die 410 by vertical wiring 460 within the chip package 500.

Figure 6:
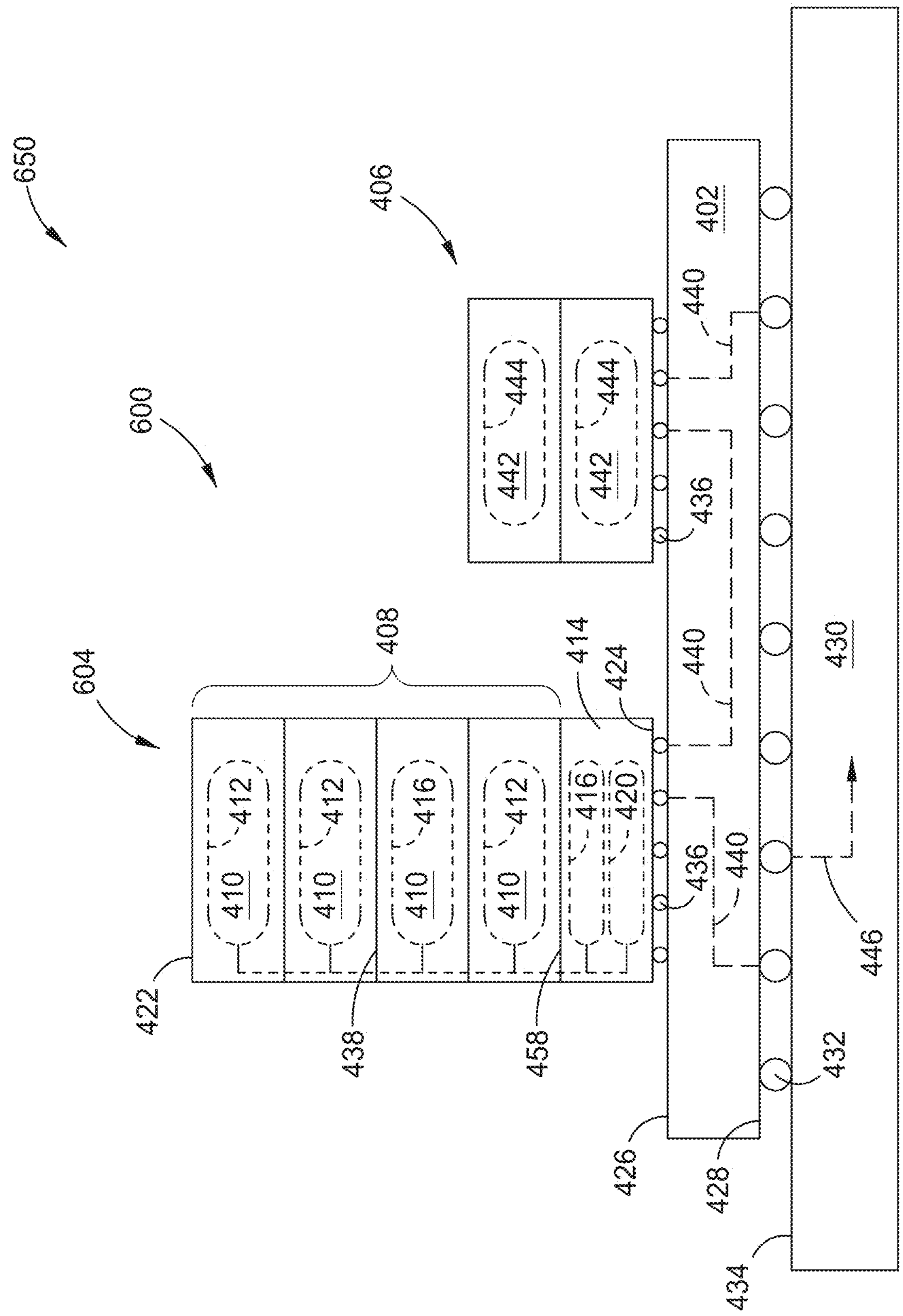
FIG. 6 is a schematic illustration of another example of a chip package having stacked integrated circuit (IC) memory dies coupled to a non-memory IC die that includes operational logic located remotely from the stacked IC memory dies.

FIG. 6 is a schematic illustration of a chip package 600 having stacked integrated circuit (IC) memory IC dies 410 coupled to a non-memory IC die 414 that includes operational circuitry 416 located remotely from the stacked memory IC dies 410.

The chip package 600 is generally the same as the chip package 400 described above, except that chip package 600 has a chip complex 604 that replaces the chip complex 404 of chip package 400. Similar to the chip complex 404, the chip complex 604 includes a memory stack 408, a non-memory IC die 414, and a base IC die 418. However, the functional circuitry 420 of the base IC die 418 is now present, along with the operational circuitry 416, in the non-memory IC die 414. Thus, the chip complex 604 does not have separate base and non-memory IC dies 418, 412, but rather a singular non-memory IC die 414 that includes both the functional circuitry 420 and the operational circuitry 416. The non-memory IC die 414 of the chip complex 604 is coupled to the substrate 402 via solder interconnects 436.

As with the chip package 400, the operational circuitry 416 of the non-memory IC die 414 is coupled to the functional circuitry 412 of the memory IC die 410 by vertical wiring 460 within the chip package 600.

Figure 7:
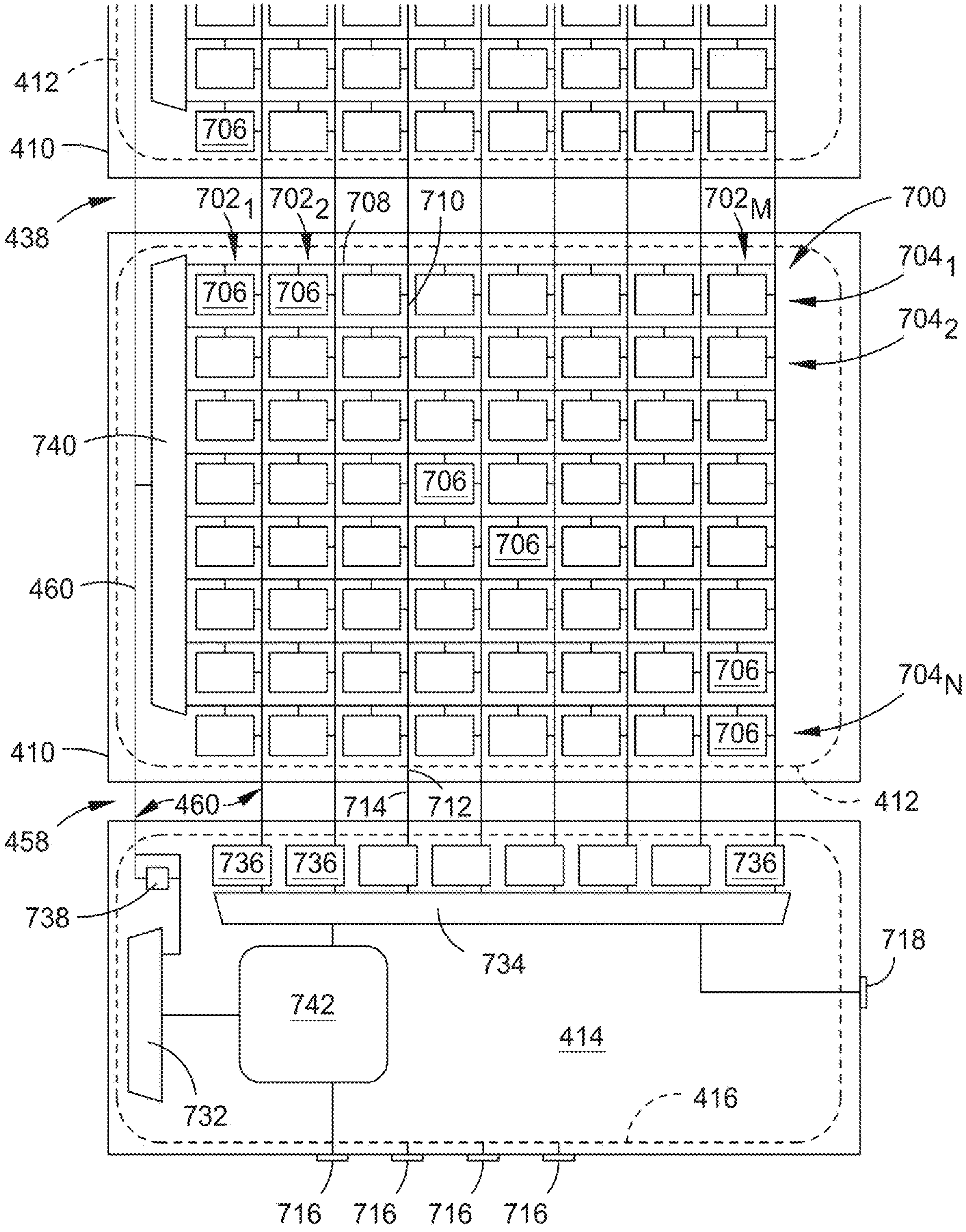
FIG. 7 is a schematic illustration of a portion of a chip package having stacked integrated circuit (IC) memory dies coupled to a non-memory IC die that includes operational logic located remotely from the stacked IC memory dies.

FIG. 7 is a schematic illustration of a portion of a chip package illustrating stacked integrated circuit (IC) memory IC dies 410 coupled to a non-memory IC die 414 that includes operational logic 416 located remotely from the stacked memory IC dies 410. The stacked memory IC dies 410 and non-memory IC die 414 may be part of any of the chip packages 400, 500, 600 described above, or other chip package having remote operational logic 412.

The operational circuitry 416 of the non-memory IC die 414 include one or more circuits selected from the group comprising memory controller circuitry 742, row decoder circuitry 732, column decoder circuitry 734, sense amplifiers 736, and sub-wordline grain select logic circuitry 738. In FIG. 7, the operational circuitry 416 includes all of the memory controller circuitry 742, the row decoder circuitry 732, the column decoder circuitry 734, the sub-wordline grain select logic circuitry 738, and sense amplifiers 736. However, any one or more of the memory controller circuitry 742, row decoder circuitry 732, column decoder circuitry 734, sub-wordline grain select logic circuitry 738, and sense amplifiers 736 may alternatively reside in the memory IC dies 410 and/or the base IC die 418, as long as a portion of the operational circuitry 416 remains remote from the memory IC die 410. In some example where the wordline is not segmented, the sub-wordline grain select logic circuitry 738 may be omitted.

The functional circuitry 412 of memory IC die 410 includes wordline driver circuitry 740 and an array 700 of memory mats 706. The array 700 may be arranged in banks, sub-banks, and the like, or other suitable arrangement. Each of the memory mats 706 includes a plurality of memory cells. Memory cells may be configured as volatile or non-volatile memory. Memory cells may be arranged in a NAND or NOR structure. In the example depicted in FIG. 7, each mat 706 is configured as an array of DRAM cells.

The memory mats 706 are arranged in an X-Y matrix. In FIG. 7, columns are indicated by reference numerals $\mathbf{702}_{1\text{-}M}$, while rows are indicated by reference numeral $\mathbf{704}_{1\text{-}N}$. M and N are positive integers greater than 2. Each row $\mathbf{704}_{1\text{-}N}$ of memory mats 706 are coupled to a respective wordline 708 associated with that row 704 via a local wordline driver. The wordline 708 is segmented via the wordline drivers, which is better illustrated in FIG. 8. Continuing to refer to FIG. 7, the wordline 708 is connected to the wordline driver circuitry 740. The wordline driver circuitry 740 is connected to the row decoder circuitry 732. The wordline driver circuitry 740 may alternatively be present in the operational circuitry 416 of the non-memory IC die 414, between the row decoder circuitry 732 and the memory IC die 410. The wordline driver circuitry 740 include voltage driver circuitry that drives a voltage through the wordline 708 connected to a selected row 704 of mats 706 for read/write operations.

Figure 8:
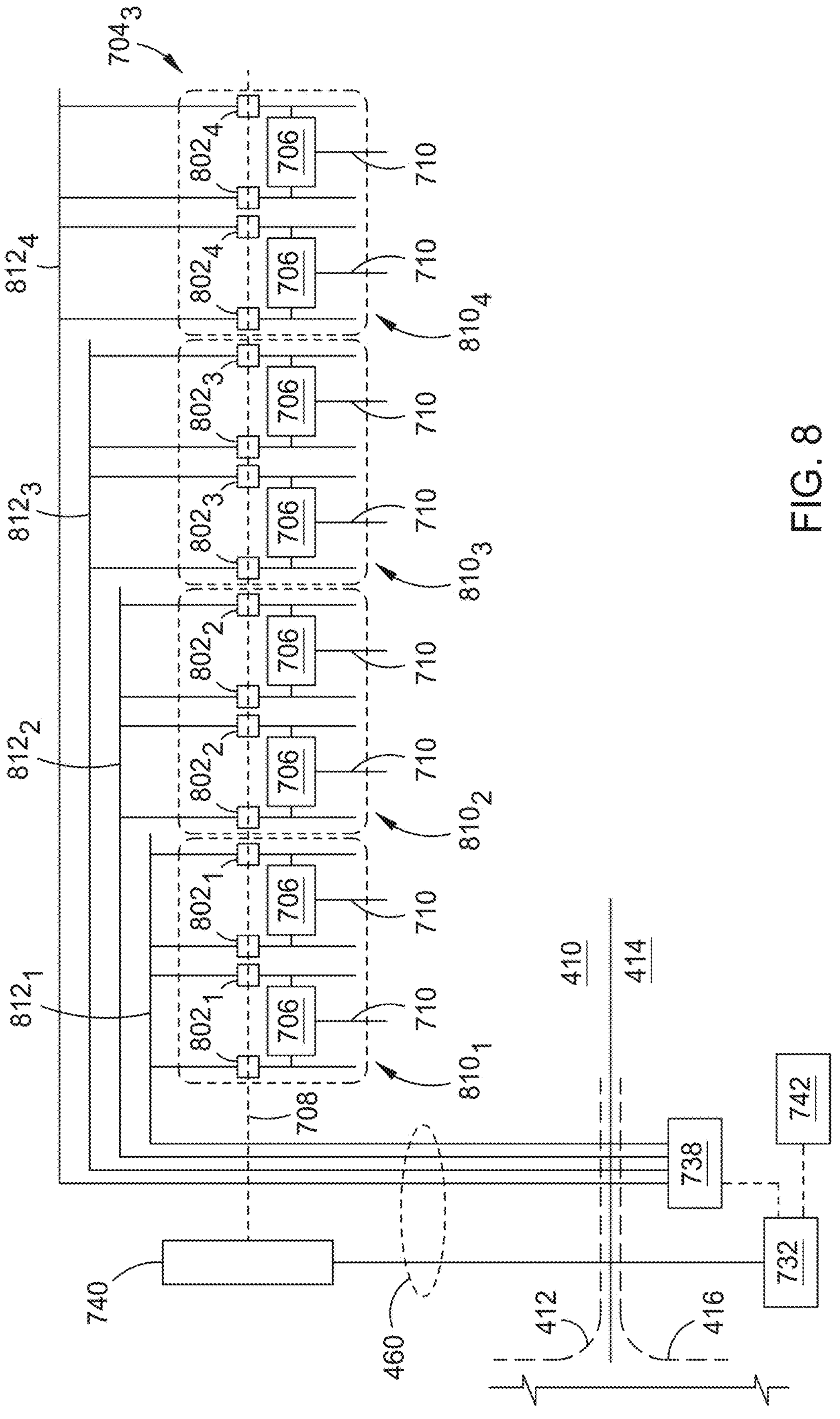
FIG. 8 is a schematic diagram of row segmentation select logic circuitry coupled to a wordline of memory circuitry of a memory die.

FIG. 8 depicts an exemplary row (row $\mathbf{704}_3$) coupled to the wordline driver circuitry 740. As illustrated in FIG. 8, the memory mats 706 within row $\mathbf{704}_3$ are grouped into different grains 810. Each grain 810 includes at least one memory mat 706. Although in FIG. 8, the grains $\mathbf{810}_1$, $\mathbf{810}_2$, $\mathbf{810}_3$, $\mathbf{810}_4$ of the row $\mathbf{704}_3$ are illustrated as each containing two memory mats 706, a different number of grains 810 which may alternatively include a different number of memory mats 706 may be utilized.

Each memory mat 702 includes at least one sub-wordline driver 802. Each sub-wordline driver 802 has an input connected to the wordline 708 and an input connected by wordline segment enable routing 812 to the sub-wordline grain select logic circuitry 738. The wordline 708 is shown as a dashed line is the wordline 708 resides on a different metal layer relative to the sub-wordline drivers 802.

An enable signal provided by the sub-wordline grain select logic circuitry 738 via the wordline segment enable routing 812 to selected ones of the sub-wordline driver 802 causes now the selected sub-wordline driver 802 to drive a voltage from the wordline 708 into the mats 706 of one or more selected grains 810 that comprise a single row 704. For example, when the sub-wordline grain select logic circuitry 738 sends an enables signal via the wordline segment enable routing 8121 to the sub-wordline drivers $\mathbf{802}_1$, the sub-wordline drivers $\mathbf{802}_1$ drive a voltage from the wordline 708 into the mats 706 of selected the grain $\mathbf{810}_1$. Similarly, when the sub-wordline grain select logic circuitry 738 sends an enables signal via the wordline segment enable routing 8122 to the sub-wordline drivers $\mathbf{802}_2$, the sub-wordline drivers $\mathbf{802}_2$ drive a voltage from the wordline 708 into the mats 706 of the selected grain $\mathbf{810}_2$. Similarly, when the sub-wordline grain select logic circuitry 738 sends an enables signal via the wordline segment enable routing 8123 to the sub-wordline drivers $\mathbf{802}_3$, the sub-wordline drivers $\mathbf{802}_3$ drive a voltage from the wordline 708 into the mats 706 of the selected grain $\mathbf{810}_3$. And again, when the sub-wordline grain select logic circuitry 738 sends an enables signal via the wordline segment enable routing 8124 to the sub-wordline drivers $\mathbf{802}_4$, the sub-wordline drivers $\mathbf{802}_4$ drive a voltage from the wordline 708 into the mats 706 of the selected grain $\mathbf{810}_4$. In this manner, only selected grains 810 are selected in a given row 704.

The wordline driver circuitry 740 is coupled to the sub-wordline grain select logic circuitry 738 and/or the row decoder circuitry 732 by individual vertical routings 460. The individual vertical routings 460 extend across the hybrid bond coupling the adjacent sides 458 of the non-memory IC die 414 and the adjacent memory IC die 410. Similarly, a portion of the wordline segment enable routing 812 includes individual vertical routings 460 that extend across the hybrid bond coupling the adjacent sides 458 of the non-memory IC die 414 and the adjacent memory IC die 410.

In one alternative example, the sub-wordline grain select logic circuitry 738 may be disposed in the memory IC die 410, and the sub-wordline grain select logic circuitry 738 may be coupled the row decoder circuitry 732 and/or memory controller 742 by vertical routing 460 across the hybrid bond coupling the adjacent sides 458 of the non-memory IC die 414 and the adjacent memory IC die 410.

The memory controller 742 provides a grain select signal that is used by the sub-wordline grain select logic circuitry 738 to couple the selected one of the grains $\mathbf{810}_1$, $\mathbf{810}_2$, $\mathbf{810}_3$, $\mathbf{810}_4$ of the row $\mathbf{704}_3$ of the array 700 of memory mats 706 to their associated $\mathbf{802}_1$, $\mathbf{802}_2$, $\mathbf{802}_3$, $\mathbf{802}_4$. Thus, the sub-wordline drivers 802 do not need to drive the voltage out across all the mats 706 the selected row $\mathbf{704}_3$, but rather only to the selected one of the grains $\mathbf{810}_1$, $\mathbf{810}_2$, $\mathbf{810}_3$, $\mathbf{810}_4$ at a single instance. This reduces the circuit size, power and time needed to drive the selected wordline segment (i.e., coupled to the selected driver $\mathbf{802}_{1\text{-}4}$) as compared to the power and time needed to simultaneously drive voltage across a wordline connected to all the mats 706 of a common row 704.

Referring back to FIG. 7, each of the mats 706 in a common column $\mathbf{702}_{1\text{-}M}$ is coupled to are coupled to a respective common bitline 710 associated with that column 702. The bitline 710 is routed vertically out of the functional circuitry 412 of the memory IC die 410 by the vertical wiring 460 through the hybrid bonded interface to the operational circuitry 416.

Each bitline 710 is coupled to a respective one of the sense amplifiers 736 residing in the operational circuitry 416 of the non-memory IC die 414. The sense amplifiers 736 are coupled by the column decoder circuitry 734 to an outlet pad 718 residing on the surface of the non-memory IC die 414. The outlet pad 718 is connected through the base IC die 418 to the routing 440 of the substrate 402 in the chip package 400 (illustrated in FIG. 4). The outlet pad 718 is connected through at least one memory IC die 410 and the base IC die 418 to the routing 440 of the substrate 402 in the chip package 500 (illustrated in FIG. 5). The outlet pad 718 is directly to the routing 440 of the substrate 402 in the chip package 400, 500, 600 (illustrated in FIGS. 4, 5 and 6). The outlet pad 718 may alternatively be coupled to the routing 440 of the substrate 402 in other manners. By locating the sense amplifiers 736 remotely from the memory IC die 410 in the non-memory IC die 414, significant space is freed in the memory IC dies 410 allowing for additional memory cells and denser routings.

The column decoder circuitry 734 is coupled to the memory controller 742. The memory controller 742 provides memory cell address information to the column decoder circuitry 734. The column decoder circuitry 734 decodes the column (702) address and couples the sense amplifier 736 of the selected column 702, which allows the output of the selected sense amplifier 736 to be coupled to the output contact pad 718.

Similarly, the row decoder circuitry 732 is coupled to the memory controller 742. The memory controller 742 provides memory cell address information to the row decoder circuitry 732. The row decoder circuitry 732 decodes the row (704) address and couples the wordline driver circuitry of sub-wordline grain select logic circuitry 738 of the selected wordline 708 of the selected row 704.

The non-memory IC die 414 additionally includes contact pads 716 for providing the operational circuitry 416 with power, ground and signal connections.

Figure 9:
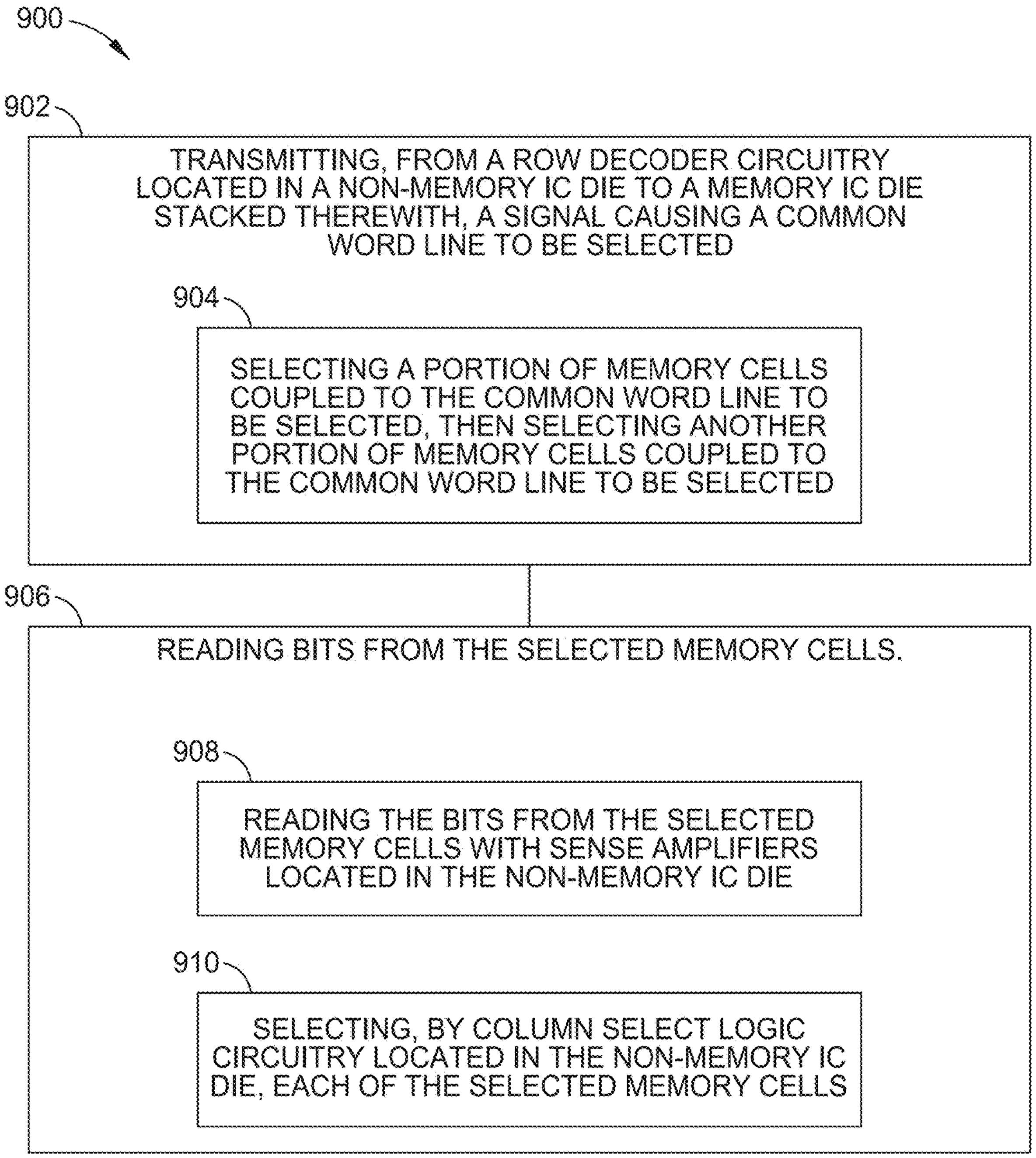
FIG. 9 is a flow diagram of a method for operating a memory device.

FIG. 9 is a flow diagram of a method 900 for operating a memory device, such as any of the chip packages 400, 500, 600 described above, or other similarly configured memory device. The method 900 begins at operation 902 by transmitting, from a row decoder circuitry located in a non-memory IC die to a memory IC die stacked therewith, a signal causing a common word line to be selected. Operation 902 may include a sub-operation 904 in which only a portion (a grain) of memory cells (or mats) coupled to the selected common word line are selected. Sub-operation 904 also includes subsequently selecting another portion of memory cells coupled to the selected common word line. Sub-operation 904 may optionally continue until all the portions (grains) are selected.

At operation 906, bits from the selected memory cells are read. In one example, operation 906 includes a sub-operation 908 in which the selected memory cells are read by reading the bits from the selected memory cells with sense amplifiers located in the non-memory IC die. In one example, operation 906 includes a sub-operation 910 in which each of the selected memory cells are selected by column select logic circuitry located in the non-memory IC die.

The method 900 may also include writing to selected memory cells. Writing to selected memory cells can include selecting a memory address using row and column select circuitry located remotely from the memory IC die, and transferring a bit from a sense amplifier located remove from the memory IC die to the memory cell residing at the memory address.

Thus, the disclosed technology that uses fine-grained rows reduces DRAM row size without increasing the DRAM die area. Compared to previous designs, the area overhead is lower to achieve the same reduction in activation energy. Furthermore, the free space in the memory die can be re-purposed for adding additional functionality such as implementing processing-in-memory (PIM) such as arithmetic-logical-units (ALUs), providing for a more flexible design. Implementing the DRAM row segmentation logic in the non-memory IC die by performing a logical AND of a grain (or sub bank) selection wire and the LWLSel wire in the non-memory IC die, and then routing the output of the AND operation vertically eliminates the need for adding circuitry to the DRAM die which helps save area. Additionally, utilizing grain select instead of energizing the entire wordline results in lower energy consumption.

While the foregoing is directed to embodiments of the present invention, other and further embodiments of the invention may be devised without departing from the basic scope thereof, and the scope thereof is determined by the claims that follow.

What is claimed is:

1. An integrated circuit (IC) memory device, comprising:

at least two or more memory IC dies stacked form a memory die stack, wherein a first memory IC die of the two or more memory IC dies further comprises a plurality of memory mats arranged in a common row, each memory mat having a local sub-wordline driver coupled thereto; and a non-memory IC die containing in-die logic circuitry having an output routed to circuitry of the memory IC dies through vertical wiring passing through the memory die stack, the in-die logic circuitry comprising row segmentation logic circuitry, wherein the row segmentation logic circuitry is disposed in the non-memory IC die and coupled to the local sub-wordline drivers by individual routing extending between the row segmentation logic circuitry and the local sub-wordline segment drivers across a hybrid bond, the row segmentation logic circuitry configured to select separate groups of the local sub-wordline drivers coupled to the memory mats within the common row.

2. The IC memory device of claim 1, wherein the non-memory IC die is disposed between two of the memory IC dies of the memory die stack.

3. The IC memory device of claim 1, wherein the non-memory IC die contacts only one of the memory IC dies of the memory die stack.

4. The IC memory device of claim 1, further comprising:

a buffer IC die disposed between the non-memory IC die and the memory die stack, the non-memory IC die coupled to wordline drivers of the memory IC dies through the buffer IC die.

5. The IC memory device of claim 1, wherein the in-die logic circuitry of the non-memory IC die comprises:

a plurality of sense amplifiers and at least one of row select logic circuitry and the column select logic circuitry.

6. An integrated circuit (IC) memory device, comprising:

at least two or more memory IC dies stacked form a memory die stack, wherein a first memory IC die of the two or more memory IC dies further comprises a row of memory mats; and a non-memory IC die containing in-die logic circuitry having an output routed to circuitry of the memory IC dies through vertical wiring passing through the memory die stack, the in-die logic circuitry comprising row segmentation logic circuitry, plurality of sense amplifiers, row select logic circuitry, and column select logic circuitry, wherein the row segmentation logic circuitry of the non-memory IC die is configured to select one or more mats from the row of mats coupled to a common word line within the first memory IC die.

7. An integrated circuit (IC) memory device, comprising:

a substrate;

at least two or more memory IC dies stacked on the substrate to form a memory die stack, wherein a first memory IC die of the two or more memory IC dies further comprises a row of memory mats, each row comprising two or more memory mats, each memory mat having at least one corresponding wordline driver; and a non-memory IC die containing row segmentation logic circuitry having routing uniquely coupled to corresponding wordline drivers of the memory IC dies through vertical wiring passing through the memory die stack.

8. The IC memory device of claim 7, wherein the non-memory IC die is disposed between the substrate and the memory die stack.

9. The IC memory device of claim 7, wherein the non-memory IC die is a logic die disposed on the substrate adjacent the memory die stack.

10. The IC memory device of claim 7, further comprising:

a buffer IC die disposed between the substrate and the memory die stack, the non-memory IC die coupled to the corresponding wordline drivers of the memory IC dies through the buffer IC die.

11. The IC memory device of claim 7, wherein the non-memory IC die further comprises:

a plurality of sense amplifiers coupled to bit lines disposed in the memory IC dies.

12. The IC memory device of claim 11, wherein the plurality of sense amplifiers are coupled to the bit lines disposed in the memory IC dies across a hybrid bonding layer coupling at least two IC dies of the IC memory device.

13. The IC memory device of claim 12, wherein the non-memory IC die further comprises:

column select logic circuitry; and row select logic circuitry.

14. The IC memory device of claim 7, wherein the non-memory IC die further comprises:

column select logic circuitry.

15. The IC memory device of claim 7, wherein the non-memory IC die further comprises:

row select logic circuity.

16. A method for operating a memory device, the method comprising:

transmitting, from a row decoder circuitry located in a non-memory IC die to a memory IC die stacked therewith, a signal causing a portion of memory grains arranged within the memory IC die in a common row and coupled to a common word line to be selected; and reading bits from the selected portion of memory grains.

17. The method of claim 16, wherein reading the bits from the selected memory grains further comprises:

reading the bits from the selected memory grains with sense amplifiers located in the non-memory IC die.

18. The method of claim 16, wherein reading the bits from the selected memory grains further comprises:

selecting, by column select logic circuitry locating in the non-memory IC die, each of the selected memory grains.

19. The IC memory device of claim 1, wherein the in-die logic circuitry comprises at least one circuitry selected from the group consisting of plurality of sense amplifiers, row select logic circuity, and column select logic circuity.

* * * * *